(12) United States Patent
Sugimoto (10) Patent No.: US 6,472,074 B2
(45) Date of Patent: Oct. 29, 2002

(54) DIELECTRIC CERAMIC COMPOSITION

(75) Inventor: Yasutaka Sugimoto, Kyoto (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/772,328

(22) Filed: Jan. 30, 2001

(65) Prior Publication Data

US 2001/0016251 A1 Aug. 23, 2001

(30) Foreign Application Priority Data

Feb. 9, 2000 (JP) .......................................... 2000-032174

(51) Int. Cl.⁷ .......................... B32B 17/06; C04B 35/46
(52) U.S. Cl. ........................ 428/432; 428/688; 501/134
(58) Field of Search .................... 501/32, 134

(56) References Cited

U.S. PATENT DOCUMENTS

| | | | |
|---|---|---|---|
| 4,665,041 A | * | 5/1987 | Higuchi et al. .............. 501/134 |
| 5,132,258 A | * | 7/1992 | Takahashi et al. ........... 501/134 |
| 5,350,721 A | * | 9/1994 | Abe et al. .................... 501/138 |
| 5,403,788 A | | 4/1995 | Nishida et al. |

FOREIGN PATENT DOCUMENTS

| EP | 0541397 A1 | 5/1993 |
|---|---|---|
| EP | 0986076 A2 | 3/2000 |

* cited by examiner

Primary Examiner—Deborah Jones
Assistant Examiner—Gwendolyn Blackwell-Rudasil
(74) Attorney, Agent, or Firm—Ostrolenk, Faber, Gerb & Soffen, LLP (57) ABSTRACT

A dielectric ceramic composition, making it possible to obtain a dielectric ceramic being able to fire at a low temperature of about 1,100° C. or less, being capable of being co-sintered with low resistance and inexpensive metals such as Ag and Cu, the dielectric constant and the Q value of which is high, and the temperature coefficient of the dielectric constant of which is small, is provided. The dielectric ceramic composition is composed of 100 parts by weight of a primary component having about 22 to 43 parts by weight of $TiO_2$, about 38 to 58 parts by weight of $ZrO_2$ and about 9 to 26 parts by weight of $SnO_2$; and about 3 to 20 parts by weight of glass containing at least B and Si.

13 Claims, 4 Drawing Sheets

DIELECTRIC CERAMIC COMPOSITION

BACKGROUND OF THE INVENTION

1. Field of the Invention

The present invention relates to dielectric ceramic compositions suitable for use in high frequency regions, for example, microwave and milliwave regions. More specifically, the present invention relates to dielectric ceramic compositions suitable for miniaturization by laminating and co-sintering with metal electrodes, and to ceramic multilayer substrates, ceramic electronic parts and laminated ceramic electronic parts using the dielectric ceramic compositions.

2. Description of the Related Art

In recent years, high frequency dielectric ceramics have been widely used in, for example, dielectric resonators and MIC dielectric substrates. In order to miniaturize high frequency dielectric ceramics, it is required that the dielectric constant be large, the Q value be large and the temperature dependency of the dielectric constant be small.

An example of high frequency dielectric ceramic compositions is disclosed in Japanese Examined Patent Application Publication No.4-59267. Herein, the dielectric ceramic composition is represented by the general formula $(Zr, Sn)TiO_4$. This dielectric ceramic composition is fired at a high temperature of 1,350° C. or more to provide a relative dielectric constant ∈r of 38 or more and a Q value of 9,000 or more at 7 GHz.

Generally, in dielectric resonators, etc., used in high frequency regions, it is necessary to use low resistance and inexpensive metals such as Ag and Cu, as electrodes. In order to co-sinter the metal and the ceramic, the ceramic must be fired at a temperature below the melting points of these metals.

The melting points, however, of the aforementioned metals are 960 to 1,063° C., which are extremely low compared to the 1,300° C. firing temperature of the aforementioned dielectric ceramic composition. Accordingly, there is a problem in that the aforementioned dielectric ceramic composition is suitable for use in high frequencies, but cannot use these metals as inner electrode materials.

Regarding the dielectric ceramic composition disclosed in the aforementioned Japanese Examined Patent Application Publication No.4-59267, the firing temperature is as high as 1,350° C. or more. Therefore, the dielectric ceramic composition could not be co-sintered with the aforementioned low resistance metals.

SUMMARY OF THE INVENTION

The object of the present invention is to provide a dielectric ceramic composition which can be fired at a temperature of about 1,100° C. or less, can be co-sintered with low resistance metals such as Ag and Cu, has a high dielectric constant, a high Q value and has a small temperature coefficient of the dielectric constant, and therefore is superior in high frequency characteristics, and exhibits high reliability in its environmental tolerance characteristics.

Another object of the present invention is to provide a ceramic multilayer substrate, a ceramic electronic part and a laminated ceramic electronic part which use the aforementioned dielectric ceramic composition, exhibit superior high frequency characteristics, and have superior reliability under the environment of high temperature, high humidity, etc.

According to an aspect of the present invention, a dielectric ceramic composition comprises 100 parts by weight of a primary component comprising about 22 to 43 parts by weight of $TiO_2$, about 38 to 58 parts by weight of $ZrO_2$ and about 9 to 26 parts by weight of $SnO_2$; and 3 to 20 parts by weight of glass containing at least B and Si.

Preferably, the dielectric ceramic composition further comprises about 10 parts by weight or less of NiO and about 7 parts by weight or less of $Ta_2O_5$.

In a specified aspect of the present invention, the glass contains an alkali oxide, an alkaline-earth metal oxide, zinc oxide, $Al_2O_3$, $B_2O_3$ and $SiO_2$, and has a composition represented by the following formulae relative to 100 weight %, on a weight % basis of the entity of the glass:

$10 \leq SiO_2 \leq 60$;

$5 \leq B_2O_3 \leq 40$;

$0 \leq Al_2O_3 \leq 30$;

$20 \leq EO \leq 70$ (wherein E: at least one element selected from alkaline-earth elements, Mg, Ca, Sr and Ba, and zinc (Zn)); and $0 \leq A_2O \leq 15$ (wherein A: at least one alkali metal element selected from Li, Na, and K).

Preferably, the dielectric ceramic composition further comprises about 7 parts by weight or less of CuO as an additive relative to 100 parts by weight of the primary component.

The present invention will be explained in detail as follows.

Because the dielectric ceramic composition according to the present invention contains about 3 to 20 parts by weight of the glass containing at least B and Si, relative to 100 parts by weight of the primary component, it can be fired at a temperature of about 1,100° C. or less, and can be co-sintered with low resistance metals such as Ag and Cu. In the present invention, the $TiO_2$ content is limited to the range of about 22 to 43 parts by weight relative to 100 parts by weight of the aforementioned primary component. When $TiO_2$ content is less than about 22 parts by weight, the dielectric constant of the resulting dielectric ceramic is decreased. When the content exceeds about 43 parts by weight, the temperature coefficient of dielectric constant of the resulting dielectric ceramic becomes too large on the positive side.

The $ZrO_2$ content is limited to the range of about 38 to 58 parts by weight. When the content is outside of this range, the temperature coefficient of the dielectric constant becomes too large on the positive side.

The $SnO_2$ content is limited to the range of about 9 to 20 parts by weight.

When the content is less than about 9 parts by weight, the temperature coefficient of the dielectric constant of the obtained dielectric ceramic becomes too large on the positive side and the Q value is decreased. When the content exceeds about 26 parts by weight, the temperature coefficient of dielectric constant of the obtained dielectric ceramic becomes too large on the negative side.

When the glass content is less than about 3 parts by weight relative to 100 parts by weight of the aforementioned primary component, it is not possible to fire at a temperature of about 1,100° C. or less. When the content exceeds about 20 parts by weight, the dielectric constant and the Q value of the obtained dielectric ceramic are decreased.

In the present invention, when about 10 parts by weight or less of NiO and about 7 parts by weight or less of $Ta_2O_5$ are added relative to 100 parts by weight of the primary component, the Q value can be improved. When the NiO content exceeds about 10 parts by weight or the $Ta_2O_5$ content exceeds about 7 parts by weight, on the contrary, the Q value of the obtained dielectric ceramic is decreased.

In the case in which the aforementioned glass component satisfies the aforementioned formulae, the sinterability at a low temperature of 1,100° C. or less is further improved, the moisture resistance of the resulting dielectric ceramic is improved, and dielectric ceramics having high Q values and high dielectric constants can be more surely obtained.

In the case in which the $SiO_2$ content is less than about 10 weight %, the moisture resistance of the obtained dielectric ceramic may be decreased and the Q value may be decreased. On the contrary, when the $SiO_2$ content of the glass exceeds about 60 weight %, the softening temperature of the glass may be increased and then the sinterability may be decreased.

In the aforementioned glass composition, in the case in which the $B_2O_3$ content is less than about 5 weight %, the softening temperature of glass may be increased and then the sinterability may be decreased. When the content exceeds about 40 weight %, the moisture resistance may be decreased.

In the aforementioned glass composition, when the $Al_2O_3$ content exceeds about 30 weight %, the softening temperature of glass may be increased and then the sinterability may be decreased.

Furthermore, in the case in which the additive proportion of the aforementioned alkaline-earth oxide or ZnO is less than about 22 weight %, the softening temperature of glass may be increased and the sinterability may be decreased. On the contrary, when the proportion exceeds about 70 weight %, the moisture resistance and the Q value of the obtained dielectric ceramic may be decreased.

In order to improve low temperature sinterability, the addition of alkali to the glass is effective. When the additive proportion, however, of the alkali oxide exceeds about 15 weight %, the moisture resistance and the Q value may be decreased.

According to another aspect of the present invention, a ceramic multilayer substrate comprises a ceramic substrate including a dielectric ceramic layer comprising the aforementioned dielectric ceramic composition and a plurality of inner electrodes formed in the aforementioned dielectric ceramic layer of the ceramic substrate. In this ceramic multilayer substrate, the dielectric ceramic layer made of the dielectric ceramic composition according to the present invention is formed, and the plurality of inner electrodes are formed in the dielectric ceramic layer. Thus, the ceramic multilayer substrate can be sintered at a low temperature of about 1,100° C. or less, the dielectric constant is high the Q value is high, and the temperature coefficient of the dielectric constant is small.

In the specified aspect of the ceramic multilayer substrate according to the present invention, a second ceramic layer having a dielectric constant which is lower than that of the inventive dielectric ceramic layer is laminated on at least one face of the dielectric ceramic layer.

In other specified aspect of the present invention, the plurality of inner electrodes are laminated with at least a part of the dielectric ceramic layer therebetween to constitute a monolithic capacitor.

In more specified aspect of the present invention, the plurality of inner electrodes are laminated with at least a part of the dielectric ceramic layer therebetween to constitute a capacitor, and coil conductors connected to each other to constitute a laminated inductor.

In another aspect of the present invention, a ceramic electronic part comprises the aforementioned ceramic multilayer substrate, and at least one electronic element mounted on the ceramic multilayer substrate and constituting a circuit together with the plurality of inner electrodes is provided. Preferably, a cap is fixed on the ceramic multilayer substrate so as to surround the aforementioned electronic element. More preferably, a conductive cap is used as the cap.

Specifically, the ceramic electronic part according to the present invention further comprises a plurality of external electrodes formed only on the bottom face of the ceramic multilayer substrate, and a plurality of through hole conductors electrically connected to the external electrodes and electrically connected to the inner electrode or electronic element.

According to another aspect of the present invention, a laminated ceramic electronic part comprises a ceramic sintered material made of a dielectric ceramic composition according to the present invention, a plurality of inner electrodes disposed in the ceramic sintered material, and a plurality of external electrodes formed on the outer surface of the ceramic sintered material, each of which is electrically connected to one of inner electrodes.

In the specified aspect of the laminated ceramic electronic part according to the present invention, the plurality of inner electrodes are disposed to be stacked with a ceramic layer therebetween to constitute a monolithic capacitor unit. In another specified aspect of the laminated ceramic electronic part according to the present invention, the plurality of inner electrodes in addition to the inner electrodes constituting the aforementioned monolithic capacitor unit include a plurality of coil conductors connected to each other to constitute a laminated inductor unit.

DESCRIPTION OF THE PREFERRED EMBODIMENTS

The present invention will be made clear below by firstly explaining a specified example of a dielectric ceramic composition according to the present invention, and then explaining a ceramic multilayer substrate, a ceramic electronic part and structural embodiments of the ceramic electronic part according to the present invention.

$SnO_2$, $TiO_2$ and $ZrO_2$ were prepared as materials for the primary component, blended in accordance with the amounts (parts by weight) as shown in Table 1 and Table 2, and wet-mixed using a ball mill for 16 hours. The mixture was dehydrated, dried, and calcined at 1,400° C. for 2 hours. $NiO_2$, $Ta_2O_5$ and CuO were added to the calcined primary component material in a proportion as shown in Table 1 and Table 2, and glass was further added in a proportion as shown in Table 1 and Table 2. After adding a binder, this mixture was wet-milled again using a ball mill for 16 hours to obtain a raw material mixture.

As the aforementioned glass, $BaCO_3$, $SrCO_3$, $CaCO_3$, $MgCO_3$, ZnO, $Al_2O_3$, $Li_2CO_3$, $Na_2CO_3$, $K_2CO_3$, $SiO_2$ and $B_2O_3$, were blended in a compounding ratio (weight ratio, the total is 100 weight %) as shown in Table 3 described below, melted in a PtRh crucible at 1,200 to 1,600° C., followed by quenching and pulverizing.

The mixture powder obtained as described above was press-molded under a pressure of 2,000 kgf/cm² in order that a disk of 10 mm in diameter×5 mm in thickness be obtained after firing. The resulting disk compacts were fired at sintering temperatures as shown in Table 1 and Table 2 below for 2 hours to obtain sintered materials of sample numbers 1 to 45.

Regarding the resulting disk sintered materials, the relative dielectric constant (εr) and the Q value at the resonant frequency (about 7 GHz) were measured using the both ends short-circuit dielectric resonance method. The results are shown in Table 1 and Table 2.

TABLE 1

| Sample No. | $TiO_2$ | $ZrO_2$ | $SnO_2$ | NiO | $Ta_2O_5$ | CuO | Kind of Glass | Glass weight % | Sintering Temp. ° C. | Relative Dielectric Constant | Q Value | τf ppm/° C. |
|---|---|---|---|---|---|---|---|---|---|---|---|---|
| 1* | 20 | 56 | 24 | 0.2 | 0.5 | 2.0 | G1 | 10 | 900 | 19 | 2300 | −11 |
| 2 | 22 | 52 | 26 | 5.0 | 5.0 | 2.0 | G1 | 10 | 900 | 27 | 2400 | −10 |
| 3 | 22 | 58 | 20 | 6.0 | 7.0 | 2.0 | G1 | 10 | 900 | 26 | 1800 | +33 |
| 4* | 22 | 58 | 20 | 5.0 | 10.0 | 2.0 | G1 | 10 | 900 | 22 | 800 | +39 |
| 5* | 32 | 52 | 16 | 20.0 | 1.0 | 2.0 | G1 | 10 | 900 | 26 | 800 | −4 |
| 6 | 32 | 52 | 16 | 10.0 | 5.0 | 2.0 | G1 | 10 | 900 | 27 | 1700 | +3 |
| 7 | 33 | 58 | 9 | 4.0 | 4.0 | 2.0 | G1 | 10 | 900 | 31 | 1700 | +29 |
| 8 | 36 | 38 | 26 | 1.0 | 1.0 | 2.0 | G1 | 10 | 900 | 31 | 2500 | +9 |
| 9* | 40 | 36 | 24 | 0.5 | 0.5 | 2.0 | G1 | 10 | 900 | 35 | 1800 | +90 |
| 10 | 40 | 39 | 21 | 0.2 | 1.0 | 2.0 | G1 | 10 | 900 | 33 | 3000 | −2 |
| 11 | 43 | 38 | 19 | 0.5 | 0.5 | 2.0 | G1 | 10 | 900 | 33 | 2300 | −51 |
| 12* | 46 | 35 | 19 | 0.2 | 1.0 | 2.0 | G1 | 10 | 900 | 34 | 2000 | +60 |
| 13* | 32 | 60 | 8 | 0.2 | 1.0 | 2.0 | G1 | 10 | 900 | 32 | 800 | +55 |
| 14* | 34 | 36 | 29 | 0.2 | 1.0 | 2.0 | G1 | 10 | 900 | 29 | 2000 | −41 |
| 15 | 40 | 39 | 21 | 0.2 | 1.0 | 0 | G1 | 10 | 1000 | 34 | 3200 | −1 |
| 16 | 40 | 39 | 21 | 0.2 | 1.0 | 7.0 | G1 | 10 | 850 | 33 | 1200 | −10 |
| 17* | 40 | 39 | 21 | 0.2 | 1.0 | 10.0 | G1 | 10 | 840 | 35 | 800 | −20 |
| 18* | 40 | 39 | 21 | 0.2 | 1.0 | 5.0 | — | 0 | 1400 | 38 | 2000 | −10 |
| 19 | 40 | 39 | 21 | 0.2 | 1.0 | 4.0 | G1 | 3 | 1000 | 36 | 1900 | −5 |
| 20 | 40 | 39 | 21 | 0.2 | 1.0 | 2.0 | G1 | 10 | 850 | 28 | 1200 | −10 |

TABLE 2

| Sample No. | $TiO_2$ | $ZrO_2$ | $SnO_2$ | NiO | $Ta_2O_5$ | CuO | Kind of Glass | Glass weight % | Sintering Temp. ° C. | Relative Dielectric Constant | Q Value | τf ppm/° C. |
|---|---|---|---|---|---|---|---|---|---|---|---|---|
| 21* | 40 | 39 | 21 | 0.2 | 1.0 | 2.0 | G1 | 300 | 800 | 19 | 800 | −15 |
| 22 | 40 | 39 | 21 | 0.2 | 1.0 | 2.0 | G2 | 10 | 880 | 32 | 3200 | 0 |
| 23* | 40 | 39 | 21 | 0.2 | 1.0 | 2.0 | G3 | 10 | 880 | 32 | 3300 | +2 |
| 24 | 40 | 39 | 21 | 0.2 | 1.0 | 2.0 | G4 | 10 | 1000 | 32 | 3500 | −5 |
| 25* | 40 | 39 | 21 | 0.2 | 1.0 | 2.0 | G5 | 10 | 1050 | 33 | 3400 | −5 |
| 26* | 40 | 39 | 21 | 0.2 | 1.0 | 2.0 | G6 | 10 | 1050 | 32 | 2800 | −10 |
| 27 | 40 | 39 | 21 | 0.2 | 1.0 | 2.0 | G7 | 10 | 1000 | 34 | 2500 | −15 |
| 28 | 40 | 39 | 21 | 0.2 | 1.0 | 2.0 | G8 | 10 | 880 | 33 | 2800 | −5 |
| 29* | 40 | 39 | 21 | 0.2 | 1.0 | 2.0 | G9 | 10 | 860 | 33 | 2000 | −3 |
| 30 | 40 | 39 | 21 | 0.2 | 1.0 | 2.0 | G10 | 10 | 900 | 33 | 2900 | −3 |
| 31 | 40 | 39 | 21 | 0.2 | 1.0 | 2.0 | G11 | 10 | 900 | 33 | 2800 | −4 |
| 32 | 40 | 39 | 21 | 0.2 | 1.0 | 2.0 | G12 | 10 | 1000 | 34 | 3100 | −7 |
| 33* | 40 | 39 | 21 | 0.2 | 1.0 | 2.0 | G13 | 10 | 860 | 33 | 2900 | 0 |
| 34 | 40 | 39 | 21 | 0.2 | 1.0 | 2.0 | G14 | 10 | 900 | 35 | 2000 | +4 |
| 35 | 40 | 39 | 21 | 0.2 | 1.0 | 2.0 | G15 | 10 | 900 | 34 | 2300 | −2 |
| 36 | 40 | 39 | 21 | 0.2 | 1.0 | 2.0 | G16 | 10 | 900 | 33 | 2600 | 0 |
| 37 | 40 | 39 | 21 | 0.2 | 1.0 | 2.0 | G17 | 10 | 900 | 32 | 2800 | −2 |
| 38 | 40 | 39 | 21 | 0.2 | 1.0 | 2.0 | G18 | 10 | 1000 | 31 | 2500 | −7 |
| 39* | 40 | 39 | 21 | 0.2 | 1.0 | 2.0 | G19 | 10 | 1050 | 30 | 2400 | −10 |
| 40 | 40 | 39 | 21 | 0.2 | 1.0 | 2.0 | G20 | 10 | 900 | 34 | 2600 | −10 |
| 41 | 40 | 39 | 21 | 0.2 | 1.0 | 2.0 | G21 | 10 | 900 | 33 | 2800 | −7 |
| 42 | 40 | 39 | 21 | 0.2 | 1.0 | 2.0 | G22 | 10 | 900 | 32 | 2700 | −5 |
| 43 | 40 | 39 | 21 | 0.2 | 1.0 | 2.0 | G23 | 10 | 900 | 32 | 2900 | −2 |
| 44* | 40 | 39 | 21 | 0.2 | 1.0 | 2.0 | G24 | 10 | 900 | 34 | 400 | −6 |
| 45* | 40 | 39 | 21 | 0.2 | 1.0 | 2.0 | G25 | 10 | 1200 | 31 | 1800 | −10 |

TABLE 3

|  | SiO$_2$ | B$_2$O$_3$ | K$_2$O | Li$_2$O | Na$_2$O | BaO | SrO | MgO | CaO | ZnO | PbO |
|---|---|---|---|---|---|---|---|---|---|---|---|
| G1 | 25 | 30 | — | 10 | — | — | — | — | — | 35 | — |
| G2 | 10 | 40 | — | 10 | — | — | — | — | — | 40 | — |
| G3* | 5 | 40 | — | 10 | — | — | — | — | — | 45 | — |
| G4 | 50 | 20 | — | 10 | — | — | — | — | — | 20 | — |
| G5* | 70 | 10 | — | 10 | — | — | — | — | — | 10 | — |
| G6* | 50 | 2 | — | 15 | — | — | — | — | — | 33 | — |
| G7 | 40 | 5 | — | 15 | — | 20 | — | — | — | 20 | — |
| G8 | 20 | 50 | — | 10 | — | — | — | — | — | 20 | — |
| G9* | 10 | 70 | — | 10 | — | 5 | — | — | — | 10 | — |
| G10 | 25 | 30 | 10 | — | — | — | — | — | — | 35 | — |
| G11 | 25 | 30 | — | — | 10 | — | — | — | — | 35 | — |
| G12 | 25 | 40 | — | — | — | — | — | — | — | 35 | — |
| G13* | 15 | 30 | — | 20 | — | — | — | — | — | 35 | — |
| G14 | 25 | 35 | — | 10 | — | 30 | — | — | — | — | — |
| G15 | 25 | 35 | — | 10 | — | — | 30 | — | — | — | — |
| G16 | 25 | 35 | — | 10 | — | — | — | 30 | — | — | — |
| G17 | 25 | 35 | — | 10 | — | — | — | — | 30 | — | — |
| G18 | 15 | 10 | — | 5 | — | — | — | — | — | 70 | — |
| G19* | 10 | 5 | — | 5 | — | — | — | — | — | 80 | — |
| G20 | 25 | 30 | — | 10 | — | — | 20 | — | — | 15 | — |
| G21 | 25 | 30 | — | 10 | — | — | — | 20 | — | 15 | — |
| G22 | 25 | 30 | — | 10 | — | — | — | — | 15 | 20 | — |
| G23 | 25 | 30 | — | 5 | — | — | — | 10 | 10 | 20 | — |
| G24* | 30 | — | — | 10 | — | — | — | — | — | — | 60 |
| G25* | 60 | — | — | 10 | — | 30 | — | — | — | — | — |

As it is clear from Table 1, in the sintered material of sample number 1, that is, in the obtained dielectric ceramic, the relative dielectric constant εr was as low as 19. This may be because blending proportion of TiO$_2$ was as low as 20 parts by weight.

In the ceramic sintered material of sample number 9, the temperature coefficient of dielectric constant τf was as large as +90. This may be because the blending proportion of ZrO$_2$ was as low as 36 parts by weight.

In the ceramic sintered material of sample number 12, the temperature coefficient of dielectric constant τf was as large as +60. This may be because the blending proportion of TiO$_2$ was as high as 46 parts by weight, and the blending proportion of ZrO$_2$ was as low as 35 parts by weight.

In the ceramic sintered material of sample number 13, the temperature coefficient of dielectric constant τf was large. This may be because the blending proportion of ZrO$_2$ was as high as 60 parts by weight, and the blending proportion of SnO$_2$ was as low as 8 parts by weight.

In the ceramic sintered material of sample number 14, the temperature coefficient of dielectric constant τf was as large in the negative side as −41. This may be because the blending proportion of ZrO$_2$ was as low as 36 parts by weight, and the blending proportion of SnO$_2$ was as high as 20 parts by weight.

In the ceramic sintered material of sample number 18, the sintering temperature was as high as 1,400° C. because the glass was not added.

As it is clear from Table 2, in the ceramic sintered material of sample number 21, the relative dielectric constant εr of the obtained dielectric ceramic was as low as 19 and the Q value also was as low as 800 because the blending proportion of the glass was too high as 30 parts by weight.

In the ceramic sintered material of sample number 44, because a glass having the composition indicated by G24 in Table 3 was used, the Q value was as low as 400.

In the ceramic sintered material of sample number 45, because a glass, having the composition indicated by G25 in Table 3 was used, the sintering temperature was as high as 1,200° C.

On the other hand, ceramic sintered materials of sample numbers being within the scope of the present invention were obtained by a low temperature firing of about 1,100° C. or less, the relative dielectric constant εr was as high as 20 or more, the Q value was as high as 500 or more, and the absolute value of the temperature coefficient of the dielectric constant τf was as small as 40 or less.

As described above, when the dielectric ceramic compositions according to the present invention is used, it is possible to fire at a low temperature, so that it is possible to be co-sintered with low resistance and inexpensive metals such as Ag and Cu, and to constitute small high frequency resonator by laminating.

Next, structural embodiments of a ceramic multilayer substrate, a ceramic electronic part and a laminated ceramic electronic part using the dielectric ceramic composition according to the present invention will be explained.

Figure 1:
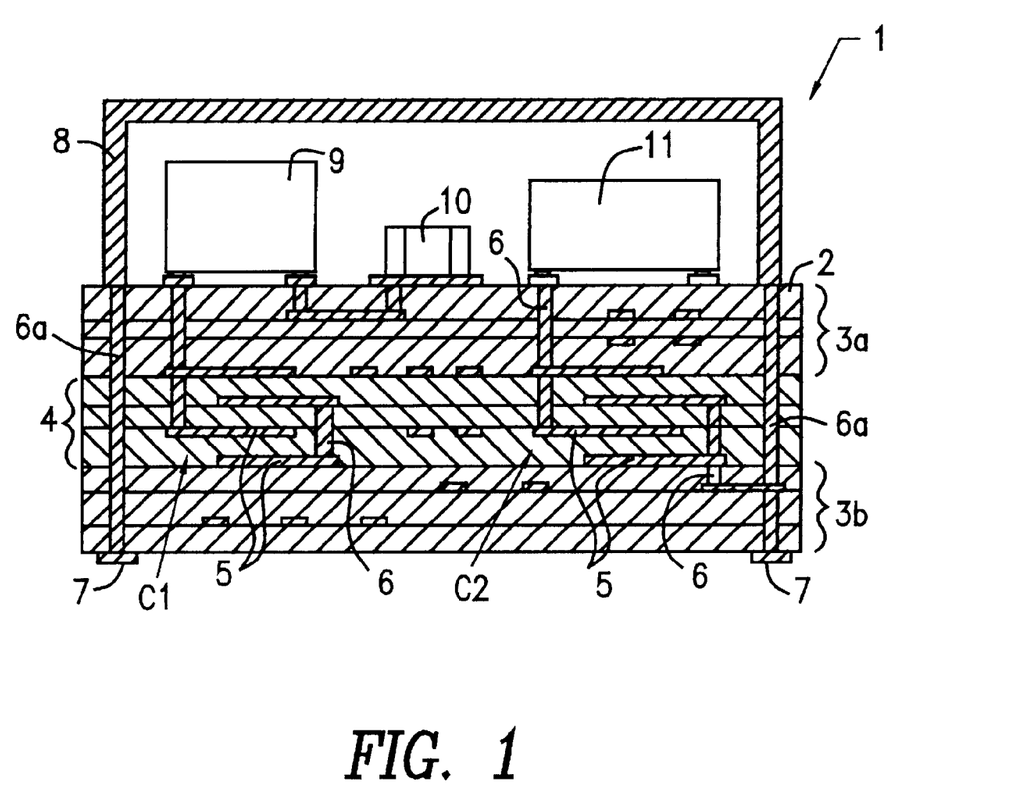
FIG. 1 is a vertical sectional view of a ceramic laminated module as a ceramic electronic part using a ceramic multilayer substrate according to an embodiment of the present invention.
Figure 2:
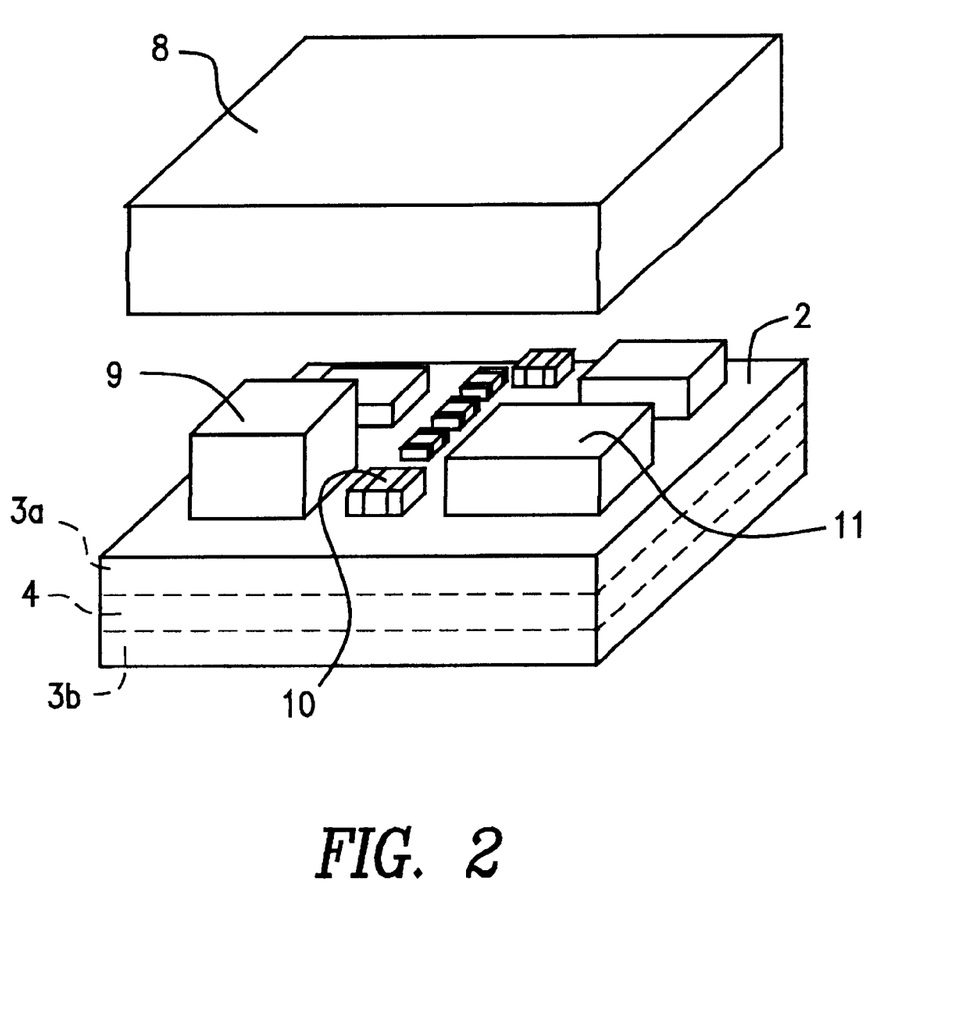
FIG. 2 is a perspective assembly view of the ceramic multilayer module shown in FIG. 1.

FIG. 1 is a sectional view showing a ceramic multilayer module as a ceramic electronic part including a ceramic multilayer substrate according to an example of the present invention, and FIG. 2 is a perspective assembly view thereof.

A ceramic multilayer module 1 is formed of a ceramic multilayer substrate 2.

In the ceramic multilayer substrate 2, a dielectric ceramic layer 4, which is made of a dielectric ceramic composition according to the present invention, and the dielectric constant of which is relatively high, is interposed between insulating ceramic layers 3a and 3b.

The ceramic material constituting the insulating ceramic layers 3a and 3b is not specifically limited as long as the dielectric constant is lower compared to the dielectric ceramic layer 4, and it can be composed of, for example, alumina and quartz.

A plurality of inner electrodes 5 are disposed so as to oppose each other with dielectric ceramic layers 4 therebetween to form monolithic capacitor units C1 and C2.

A plurality of via hole electrodes 6 and 6a, and internal leads are formed in the insulating ceramic layers, 3a and 3b, and the dielectric ceramic layer 4. Electronic elements 9 to 11 are mounted on the top face of the ceramic multilayer substrate 2. As the electronic elements 9 to 11, appropriate electronic elements such as semiconductor devices and chip monolithic capacitors can be used.

These electronic elements 9 to 11 and capacitor units C1 and C2 are electrically connected via the aforementioned via hole electrode 6 and internal leads to constitute a circuit of the ceramic multilayer module 1 according to this embodiment.

A conductive cap 8 is fixed on the top face of the aforementioned ceramic multilayer substrate 2. The conductive cap 8 is electrically connected to the via hole electrode 6 penetrating the ceramic multilayer substrate 2 from the top face toward the bottom face. External electrodes 7,7 are formed on the bottom face of the ceramic multilayer substrate 2, and are electrically connected to the via hole electrodes 6 and 6a. Other external electrodes, not illustrated in the drawings, are formed only on the bottom face of the ceramic multilayer substrate 2, like the aforementioned external electrode 7. The other external electrodes are electrically connected to the electronic elements 9 to 11 and capacitor units C1 and C2 via the aforementioned internal leads.

Thus, by forming the external electrode 7 for external connection only on the bottom face of the ceramic multilayer substrate 2, the ceramic laminated module can be easily surface mounted on printed circuit substrates, etc., using the bottom face side.

In this embodiment, because the cap 8 is made of a conductive material and is electrically connected to the external electrode 7 via the via hole electrode 6, the electronic elements 9 to 11 can be electromagnetically shielded by the conductive cap 8. The cap 8, however, is not necessary composed of a conductive material.

In the ceramic multilayer module 1 according to this embodiment, because the monolithic capacitor units C1 and C2 are formed of the dielectric ceramic composition according to the present invention in the ceramic multilayer substrate 2 as described above, the inner electrodes 5, electrodes for constituting outer circuits, and the via hole electrodes 6 and 6a can be formed of low-resistance and inexpensive metals, such as Ag and Cu, and these can be co-sintered. Thus, the capacitor units C1 and C2 can be formed of the integrally sintered ceramic multilayer substrate 2 so that it can be miniaturized. In addition, because the aforementioned dielectric ceramic layer 4 uses the dielectric ceramic composition according to the present invention, the dielectric constant thereof is high and the Q value thereof also is high.

Accordingly, the resulting ceramic multilayer module 1 is suitable for use in high frequency regions.

The aforementioned ceramic multilayer substrate 2 can be easily obtained using a well-known ceramic lamination and integral firing technique. That is, ceramic green sheets mainly having the dielectric ceramic composition according to the present invention are prepared. Electrode patterns for constituting the inner electrodes 5, outer circuits and the via hole electrodes 6 and 6a, etc., are printed on the ceramic green sheets. Next, these green sheets are laminated. Furthermore, an appropriate number of ceramic green sheets for forming the insulating ceramic layers 3a and 3b on the top and bottom thereof, on which electrode patterns for constituting the outer circuits and the via hole electrodes 6 and 6a are formed, are laminated and pressed in the direction of the thickness. By firing the resulting laminate, the ceramic multilayer substrate 2 is easily obtained.

In the monolithic capacitor units C1 and C2, because the dielectric ceramic layer is disposed between the neighboring, in the direction of the thickness, inner electrodes 5 and 5 for defining the capacitance, large capacitance can be obtained using inner electrodes of relatively small areas, and the miniaturization is, thereby, readily achieved.

Figure 3:
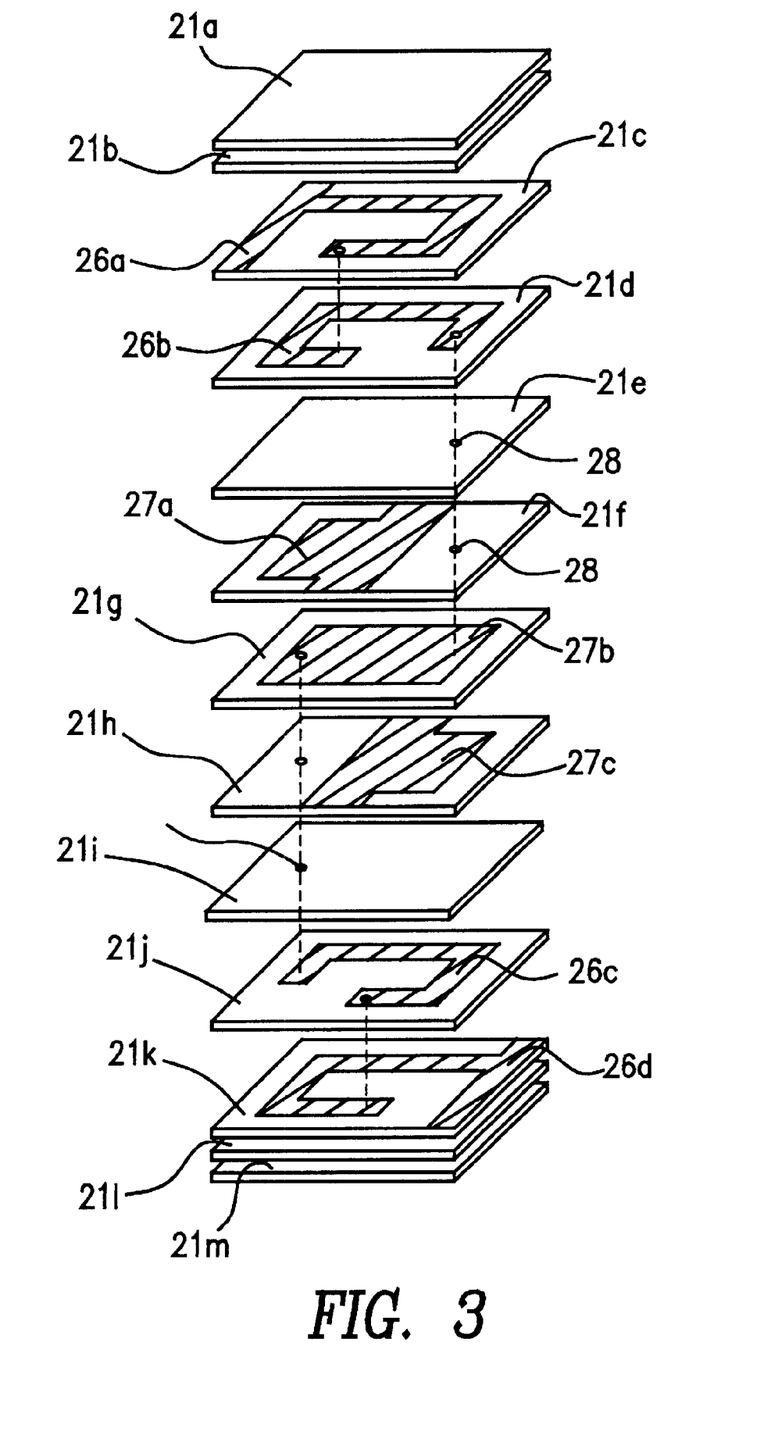
FIG. 3 is a perspective assembly view for explaining ceramic green sheets used to manufacture the laminated ceramic electronic part according to the second embodiment of the present invention, and electrode patterns formed thereon.
Figure 4:
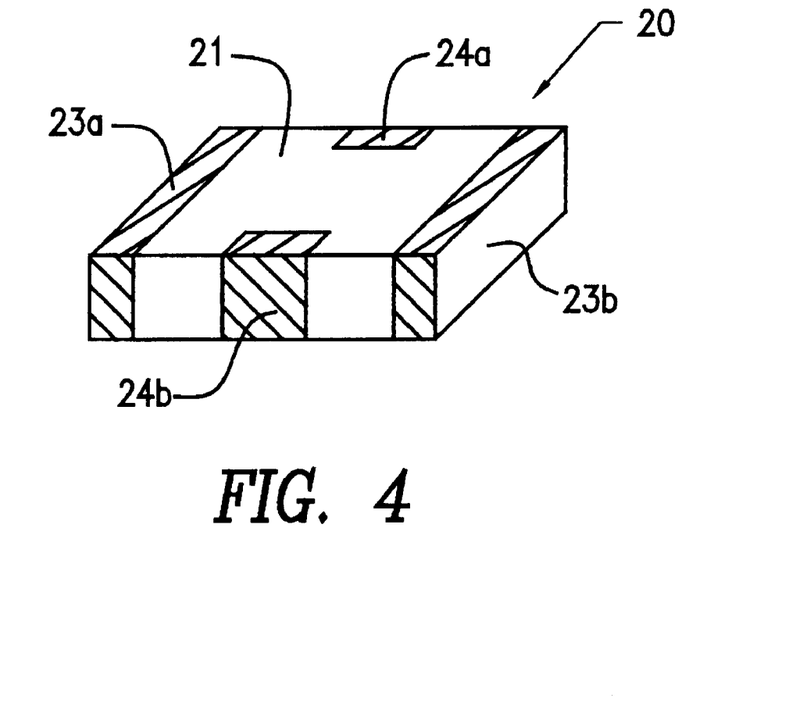
FIG. 4 is a perspective view of a laminated ceramic electronic part according to the second embodiment of the present invention.
Figure 5:
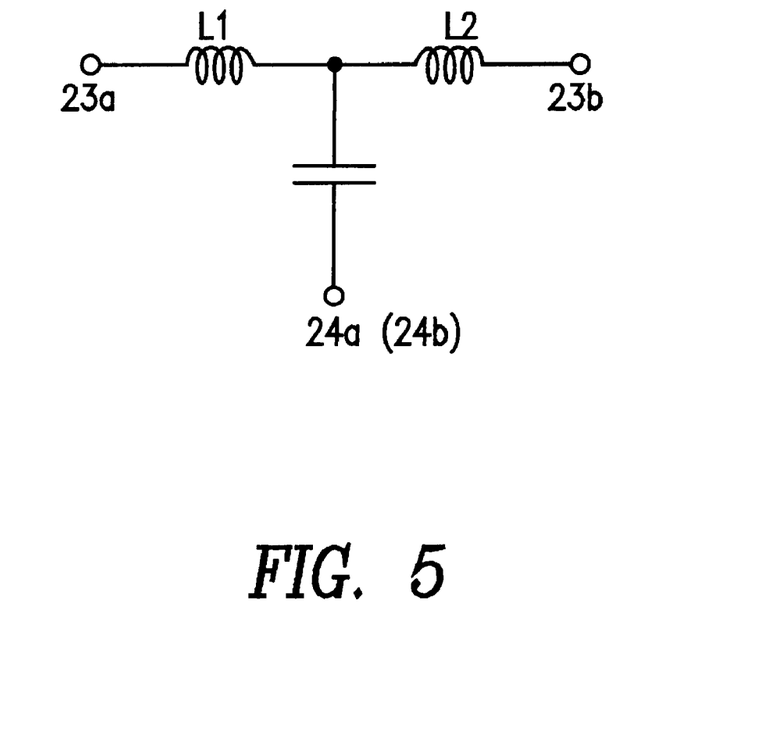
FIG. 5 is a diagram of a circuit configuration of the laminated ceramic electronic part shown in FIG. 4.

FIG. 3 to FIG. 5 are a perspective assembly view and a circuit diagram, respectively, for explaining a laminated ceramic electronic part as a second structural embodiment according to the present invention. The laminated ceramic electronic part 20 shown in FIG. 4 is an LC filter. In a ceramic sintered material 21, a circuit constituting the inductance L and the capacitance C is described below. The ceramic sintered material 21 is constituted using the high frequency dielectric ceramic composition according to the present invention. External electrodes 23a, 23b, 24a and 24b are formed on the outer surface of the ceramic sintered material 21, and an LC resonant circuit shown in FIG. 5 is constituted between the external electrodes 23a, 23b, 24a and 24b.

Next, the constitution of the aforementioned ceramic sintered material 21 will be made clear by the explanation of manufacturing method with reference to FIG. 3.

An organic vehicle is added to the dielectric ceramic composition material according to the present invention to obtain ceramic slurry. The ceramic slurry is shaped into the ceramic green sheet using an appropriate sheet molding method. The resulting ceramic green sheet is dried, and is then punched to prepare rectangular ceramic green sheets 21a to 21m of a predetermined size.

If necessary, a through hole, for constituting a via hole electrode 28, is formed in the ceramic green sheets 21a to 21m. Furthermore, a conductive paste is applied by screen printing to form coil conductors 26a and 26b, inner electrodes 27a to 27c for a capacitor, and coil conductors 26c and 26d, and the aforementioned penetrated hole is filled with the conductive paste to form the via hole electrode 28.

Then, the ceramic green sheets 21a to 21m are laminated in the direction shown in the drawing, and are pressed in the direction of the thickness to obtain a laminate.

The resulting laminate is fired to obtain the ceramic sintered material 21.

External electrodes 23a to 24b are formed as shown in FIG. 4 on the ceramic sintered material 21 using a thin film making method, for example, by coating and baking a conductive paste, by vapor deposition, plating or sputtering. The laminated ceramic electronic part 20 can thereby be made.

As it is clear from FIG. 3, an inductance unit L1 shown in FIG. 5 is composed of the coil conductors 26a and 26b, an inductance unit L2 is composed of the coil conductors 26c and 26d, and a capacitor C is composed of the inner electrodes 27a to 27c.

In the laminated ceramic electronic part 20 of the present example, the LC filter is constituted as described above. Because the ceramic sintered material 21 is constituted using the dielectric ceramic composition according to the present invention, similarly to the ceramic multilayer substrate 2 according to the first example, it can be obtained by a low temperature firing, and therefore can be integrally fired with the ceramics using low melting point metals, for example, copper, silver and gold, as the aforementioned coil conductors 26a to 26c for the inner electrodes, or as the inner electrodes 27a to 27c for the capacitor. In addition, this LC filter is appropriate for use in high frequency regions, the relative dielectric constant is high the Q value in high frequencies is high, and the change of the temperature coefficient of the resonant frequency τf is small.

In the aforementioned first and second structural embodiments, the ceramic multilayer module 1 and the laminated ceramic electronic part 20 constituting the LC filter were described; however, the ceramic electronic part and the laminated ceramic electronic part according to the present invention are not limited to these structures. That is, it can be applied to various ceramic multilayer substrates such as ceramic multilayer substrates for multichip modules and ceramic multilayer substrates for hybrid ICs, or various ceramic electronic parts in which electronic elements are mounted on these ceramic multilayer substrates, and furthermore, to various chip type laminated electronic parts such as chip type monolithic capacitors and chip type laminated dielectric antennas.

In the dielectric ceramic composition according to the present invention, because about 3 to 20 parts by weight of the glass, containing at least B and Si, is added to 100 parts by weight of the primary component consisting of about 22 to 43 parts by weight of $TiO_2$, about 38 to 58 parts by weight of $ZrO_2$, and about 9 to 26 parts by weight of $SnO_2$, it is obtained by the low temperature firing at about 1,100° C. or less, so that it is possible to co-sinter low resistance and inexpensive metals such as Ag and Cu. Therefore, for example, in the ceramic multilayer substrates and the laminated ceramic electronic parts, these metals can be used as inner electrode materials, and the ceramic multilayer substrates and the laminated ceramic electronic parts can be miniaturized.

In addition, the relative dielectric constant is as high as about 20 or more, the Q value is as high as 500 or more at 7 GHz, and furthermore, the temperature dependency of the resonant frequency is small, and at high frequencies, it is appropriately used to constitute capacitors and LC resonant circuits.

In the case in which about 10 parts by weight or less of NiO and about 7 parts by weight or less of $Ta_2O_5$ are further contained relative to 100 parts by weight of the aforementioned primary component, it is possible to further improve the Q value.

In the dielectric ceramic composition according to the present invention, in the case in which the aforementioned glass has the composition being within the range represented by the aforementioned formulae, it can be sintered at about 1,000° C. or less while maintaining high Q values and high relative dielectric constants.

Furthermore, in the case in which CuO as an additive is further contained in a proportion of about 7 parts by weight or less relative to 100 parts by weight of the aforementioned primary component, the low temperature sinterability can be further improved.

Because the ceramic multilayer substrate according to the present invention has a structure in which the plurality of inner electrodes are formed in the ceramic substrate including a dielectric ceramic layer made of the dielectric ceramic composition according to the present invention, it can be fired at a low temperature, and low resistance and inexpensive metals such as Ag and Cu can be used as the constitution materials of the inner electrode. Furthermore, in the dielectric ceramic layer, because the dielectric constant is high, the Q value is high, and the temperature dependency of the resonant frequency is small, a ceramic multilayer substrate being appropriate for using high frequencies can be provided.

In the ceramic multilayer substrate, in the case in which the second ceramic layer, the dielectric constant of which is lower compared to the aforementioned dielectric ceramic layer, is laminated on at least a face of the dielectric ceramic layer, by adjusting the composition and the lamination form of the second ceramic layer, the strength and the environmental tolerance characteristics can be appropriately controlled in accordance with requirements.

In the case in which the plurality of inner electrodes are laminated interposing at least a part of the dielectric ceramic layer and thereby a monolithic capacitor is constituted, because the dielectric constant of the dielectric ceramic composition according to the present invention is high and the Q value is high, it is appropriate for used at high frequencies, and large capacitance can be easily formed.

Furthermore, because the dielectric constant is high, the facing area of the external electrode can be made small, and thereby the size of the capacitor portion can be made small.

In the case in which the plurality of inner electrodes include the inner electrodes constituting the monolithic capacitor and a plurality of coil conductors connected to each other to constitute the laminated inductor, because, as described above, in the dielectric ceramic composition according to the present invention, the dielectric constant is high, the Q value is high at high frequencies, and the temperature dependency of the resonant frequency is small, a small LC resonant circuit appropriate for use in high frequencies can be easily constituted.

In the ceramic electronic parts according to the present invention in which at least an electronic element is laminated on the ceramic multilayer substrates according to the present invention, using the aforementioned electronic element and the circuit constitution in the ceramic multilayer substrates, various small ceramic electronic parts being appropriate for use in high frequencies can be provided.

In the case in which a cap is fixed on the ceramic multilayer substrate surrounding the electronic element, because the electronic element can be protected with the cap, ceramic electronic parts being superior in the moisture resistance, etc., can be provided.

In the case in which the conductive cap is used as the cap, the surrounded electronic element can be electromagnetically shielded.

In the case in which the external electrode is formed only on the bottom face of the ceramic multilayer substrate, it can be easily surface mounted on printed circuit substrates, etc., from the bottom face side of the ceramic multilayer substrate.

In a laminated ceramic electronic parts according to the present invention, because a plurality of inner electrodes are formed in the dielectric ceramic composition according to the present invention, it can be fired at a low temperature, and low resistance and inexpensive metals such as Ag and Cu can be used as the constitution materials of the inner electrode. Furthermore, in the dielectric ceramic composition, the dielectric constant is high, the Q value is high and the temperature dependency of the resonant frequency is small, and therefore a monolithic capacitor being appropriate for using high frequencies can be provided.

In the laminated ceramic electronic parts according to the present invention, in the case in which the plurality of inner electrodes constitute a monolithic capacitor, because the dielectric constant of the dielectric ceramic composition according to the present invention is high and the Q value is high, it is appropriate for use at high frequencies, and large capacitance can be easily formed. Furthermore, because the dielectric constant is high, the facing area of the external electrode can be made small, and thereby the size of the capacitor portion can be made small, too.

In the laminated ceramic electronic parts according to the present invention, in the case of a plurality of inner electrodes include the inner electrodes constituting the monolithic capacitor and coil conductors constituting the laminated inductor, because, as described above, in the dielectric ceramic composition according to the present invention, the dielectric constant is high, the Q value is high in high frequencies and the temperature dependency of the resonant frequency is small, a small LC resonant circuit being appropriate for use at high frequencies can be easily constituted.

What is claimed is:

1. A ceramic multilayer substrate comprising a ceramic substrate having at least two faces and comprising a plurality of dielectric ceramic layers of which at least one is of a dielectric ceramic composition and a plurality of inner electrodes disposed within said ceramic substrate, wherein said dielectric ceramic composition comprises:
   (a) 100 parts by weight of a primary component comprising about 22 to 43 parts by weight of $TiO_2$, about 38 to 58 parts by weight of $ZrO_2$ and about 9 to 26 parts by weight of $SnO_2$;
   (b) about 3 to 20 parts by weight of glass containing B and Si, wherein said glass contains an alkali oxide, an alkaline-earth metal oxide, zinc oxide, $Al_2O_3$, $B_2O_3$ and $SiO_2$, and has a composition represented by the following formulae relative to 100 weight %, on a weight % basis of the entity of the glass:
   $10 \leq SiO_2 \leq 60$;
   $5 \leq B_2O_3 \leq 40$;
   $0 \leq Al_2O_3 \leq 30$;
   $20 \leq EO \leq 70$, wherein E is Zn and at least one element selected from Mg, Ca, Sr and Ba;
   $0 \leq A_2O \leq 15$, wherein A is at least one of Li, Na, and K;
   (c) NiO in an amount of up to about 10 parts by weight and $Ta_2O_5$ in an amount of up to about 7 parts by weight; and
   (d) CuO as an additive in an amount of up to about 7 parts by weight relative to 100 parts by weight of said primary component.

2. A cermaic multiplayer substrate comprising a cermic substrate having at least two faces and comprising a plurality of dielectric ceramic layers of which at least one is of a dielectric cermic composition and a plurality on inner electrodes disposed within said cermaic substrate, wherein said dielectric ceramic composition comprises 100 parts by weight of a primary component comprising about 22 to 43 parts by weight of $TiO_2$, about 38 to 58 parts by weight of $ZrO_2$ and about 9 to 26 parts by weight of $SnO_2$; and about 3 to 20 parts by weight of glass containing B and Si.

3. A ceramic multilayer substrate according to claim 2, wherein a second ceramic layer having a dielectric constant which is lower than that of said dielectric ceramic layer of said dielectric ceramic composition laminated on at least one face of said dielectric ceramic layer.

4. A ceramic multilayer substrate according to claim 2, wherein said plurality of inner electrodes are disposed with at least a part of a dielectric ceramic layer therebetween to constitute a monolithic capacitor.

5. A ceramic multilayer substrate according to claim 2, wherein said plurality of inner electrodes are disposed with at least a part of a dielectric ceramic layer therebetween to constitute a capacitor, and having at least two coil conductors connected to each other to constitute a laminated inductor.

6. A ceramic electronic part comprising a ceramic multilayer substrate according to claim 2, having at least one electronic element mounted on said ceramic multilayer substrate and forming a circuit together with said plurality of inner electrodes.

7. A ceramic electronic part according to claim 6, further comprising a cap fixed on said ceramic multilayer substrate so as to surround said electronic element.

8. A ceramic electronic part according to claim 7, wherein said cap is conductive.

9. An electronic part according to claim 6, further comprising a plurality of external electrodes on a face of said ceramic multilayer substrate on which said electronic element is not mounted, and a plurality of through hole conductors in said substrate electrically connected to said external electrodes.

10. A laminated ceramic electronic part comprising a ceramic sintered material of a dielectric ceramic composition, a plurality of inner electrodes disposed in said ceramic sintered material, and a plurality of external electrodes each of which is disposed on an outer surface of said ceramic sintered material and electrically connected to one of inner electrodes, wherein said dielectric ceramic composition comprises:
   (a) 100 parts by weight of a primary component comprising about 22 to 43 parts by weight of $TiO_2$, about 38 to 58 parts by weight of $ZrO_2$ and about 9 to 26 parts by weight of $SnO_2$;
   (b) about 3 to 20 parts by weight of glass containing B and Si, wherein said glass contains an alkali oxide, an alkaline-earth metal oxide, zinc oxide, $Al_2O_3$, $B_2O_3$ and $SiO_2$, and has a composition represented by the following formulae relative to 100 weight %, on a weight % basis of the entity of the glass:
   $10 \leq SiO_2 \leq 60$;
   $5 \leq B_2O_3 \leq 40$;
   $0 \leq Al_2O_3 \leq 30$;
   $20 \leq EO \leq 70$, wherein E is Zn and at least one element selected from Mg, Ca, Sr and Ba; and
   $0 \leq A_2O \leq 15$, wherein A is at least one of Li, Na, and K;
   (c) NiO in an amount of up to about 10 parts by weights and $Ta_2O_5$ in an amount of up to about 7 parts by weight; and
   (d) CuO as an additive in an amount of up to about 7 parts by weight relative to 100 parts by weight of said primary component.

11. A laminated ceramic electronic part comprising a ceramic sintered material of a dielectric ceramic composition, a plurality of inner electrodes disposed in said ceramic sintered material, and a plurality of external electrodes each of which is disposed on an outer surface of said dielectric ceramic sintered material and electrically connected to one of inner electrodes, wherein said ceramic composition comprises 100 parts by weight of a primary component comprising about 22 to 43 parts by weight of $TiO_2$, about 38 to 58 parts by weight of $ZrO_2$ and about 9 to 26 parts by weight of $SnO_2$; and about 3 to 20 parts by weight glass containing B and Si.

12. A laminated ceramic electronic part according to claim 11, wherein said plurality of inner electrodes are disposed with a ceramic layer therebetween to thereby constitute a capacitor unit.

13. A laminated ceramic electronic part according to claim 11, wherein said plurality on inner electrodes include, in addition to said inner electrodes constituting said capacitor unit, a plurality of coil conductors connected to each other to constitute a laminated inductor unit.

* * * * *